(12) United States Patent
Mizumura

(10) Patent No.: US 8,329,490 B2
(45) Date of Patent: Dec. 11, 2012

(54) METHOD OF PRODUCING A SOLID-STATE IMAGE PICKUP APPARATUS, SOLID-STATE IMAGE PICKUP APPARATUS, AND ELECTRONIC APPARATUS

(75) Inventor: Akira Mizumura, Tokyo (JP)

(73) Assignee: Sony Corporation, Tokyo (JP)

( * ) Notice: Subject to any disclaimer, the term of this patent is extended or adjusted under 35 U.S.C. 154(b) by 357 days.

(21) Appl. No.: 12/656,044

(22) Filed: Jan. 14, 2010

(65) Prior Publication Data

US 2010/0220227 A1 Sep. 2, 2010

(30) Foreign Application Priority Data

Feb. 27, 2009 (JP) ................................ 2009-044975

(51) Int. Cl.
*H01L 21/00* (2006.01)
*H04N 3/14* (2006.01)
(52) U.S. Cl. .............................. 438/48; 438/43; 348/294
(58) Field of Classification Search .................. 348/294, 348/315; 438/40, 43, 48, 254, 286; 257/291, 257/292

See application file for complete search history.

(56) References Cited

U.S. PATENT DOCUMENTS

| 6,160,281 | A * | 12/2000 | Guidash ......................... 257/292 |
| 6,162,677 | A * | 12/2000 | Miyakawa et al. ............ 438/254 |
| 6,977,684 | B1 * | 12/2005 | Hashimoto et al. ........... 348/294 |
| 7,897,425 | B2 * | 3/2011 | Baek et al. ....................... 438/57 |
| 2003/0228736 | A1 * | 12/2003 | Kimura .......................... 438/286 |
| 2008/0315271 | A1 * | 12/2008 | Baek et al. ...................... 438/69 |
| 2009/0050997 | A1 * | 2/2009 | Mutoh ............................ 438/69 |
| 2009/0225209 | A1 * | 9/2009 | Arakawa ....................... 348/306 |

FOREIGN PATENT DOCUMENTS

JP 2007-335905 12/2007

* cited by examiner

*Primary Examiner* — Nhan T Tran
(74) *Attorney, Agent, or Firm* — Rader Fishman & Grauer, PLLC

(57) ABSTRACT

A method of producing a solid-state image pickup apparatus, including the steps of: forming a plurality of light-receiving portions on a substrate; forming a plurality of transfer gates to be connected to the plurality of light-receiving portions formed on the substrate; forming an insulation film on the substrate; exposing a base by etching the insulation film so that the etched part of the insulation film between the adjacent transfer gates tapers away; and injecting an impurity into the exposed part using the insulation film that has remained after the etching as a mask to thus form an impurity injection portion.

5 Claims, 10 Drawing Sheets

- 21 Photodiode
- 22 Transfer transistor
- 23 Reset transistor
- 24 Amplification transistor
- 25 Selection transistor
- 26 Floating diffusion (FD) portion

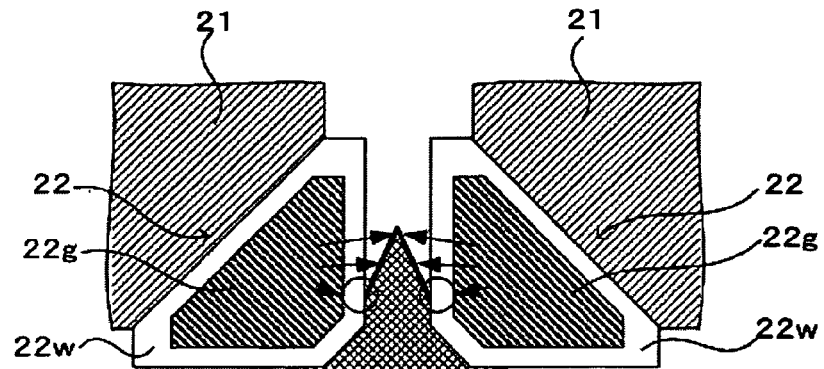
FIG.10A
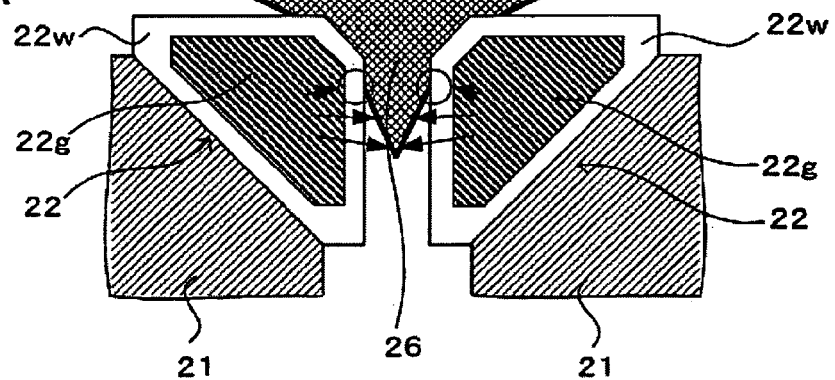
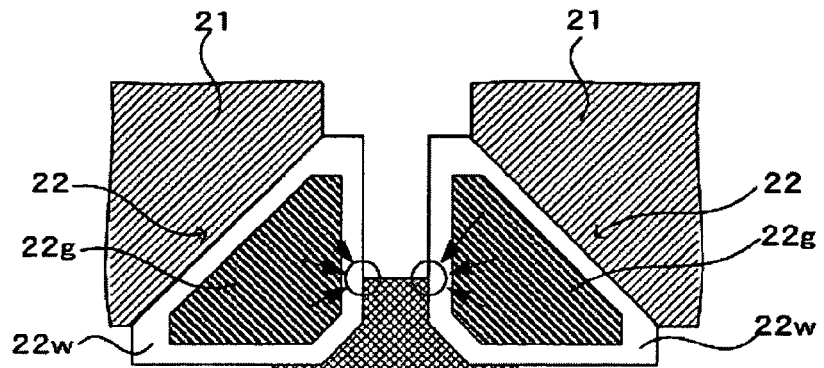
FIG.10B
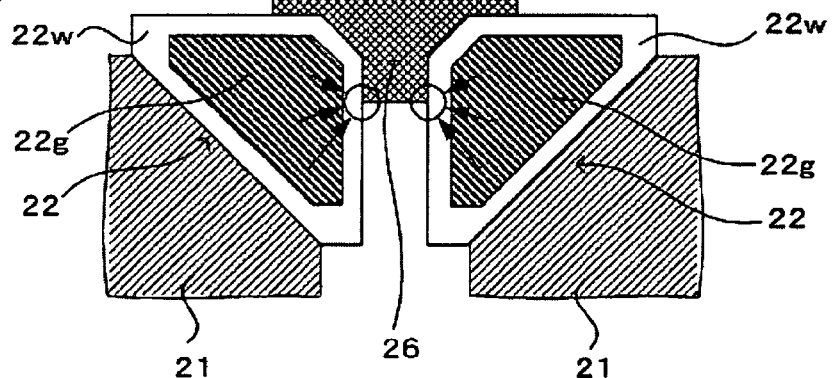

METHOD OF PRODUCING A SOLID-STATE IMAGE PICKUP APPARATUS, SOLID-STATE IMAGE PICKUP APPARATUS, AND ELECTRONIC APPARATUS

BACKGROUND OF THE INVENTION

1. Field of the Invention

The present invention relates to a method of producing a solid-state image pickup apparatus, a solid-state image pickup apparatus, and an electronic apparatus, more specifically, to a method of producing a solid-state image pickup apparatus, a solid-state image pickup apparatus, and an electronic apparatus having characteristics in a method of producing a charge voltage conversion portion that is shared by a plurality of light-receiving portions and a structure thereof.

2. Description of the Related Art

A large number of CMOS (Complementary Metal Oxide Semiconductor)- and MOS (Metal Oxide Semiconductor)-type solid-state image pickup apparatuses are mounted on a digital camera, a video camera, a copying machine, a camera-equipped cellular phone, and the like. The solid-state image pickup apparatuses tend to be miniaturized and increased in the number of pixels, and an area of a photodiode tends to be on the decrease. As a result, since a signal charge amount also decreases, there is a need to suppress a leak current in a photodiode, a floating diffusion, and a reset transistor to be small to thus suppress noises.

Here, in a solid-state image pickup apparatus that shares a single floating diffusion among a plurality of pixels, a light-receiving portion and a transfer gate are first formed in forming a floating diffusion. After that, a resist mask is opened by patterning, and an impurity is injected via the opening to thus form a floating diffusion at a position corresponding to the opening (see, for example, Japanese Patent Application Laid-open No. 2007-335905).

SUMMARY OF THE INVENTION

However, in the solid-state image pickup apparatus that shares the floating diffusion among the plurality of pixels, a positional deviation of the resist mask occurs in forming the floating diffusion. When the positional deviation occurs, signal detection characteristics vary among the pixels sharing the same floating diffusion, thus inducing a problem on deterioration of an image quality. Moreover, a high-electric-field area due to an electric field concentration is caused in an area where a side wall of the transfer gate and the floating diffusion area intersect, with the result that a white spot due to a leak current is caused.

In view of the circumstances as described above, there is a need to suppress variations of signal detection characteristics among pixels and suppress generation of a white spot due to a leak current.

According to an embodiment of the present invention, there is provided a method of producing a solid-state image pickup apparatus, including the steps of: forming a plurality of light-receiving portions on a substrate; forming a plurality of transfer gates to be connected to the plurality of light-receiving portions formed on the substrate; forming an insulation film on the substrate; exposing a base by etching the insulation film so that the etched part of the insulation film between the adjacent transfer gates tapers away; and injecting an impurity into the exposed part using the insulation film that has remained after the etching as a mask to thus form an impurity injection portion.

With such a structure, with an opening that is formed by etching the insulation film formed on the transfer gates as a mask, an impurity injection portion is formed in a self-aligning manner between the adjacent transfer gates. Moreover, since the base is exposed in a state where the etched part of the insulation film between the adjacent transfer gates tapers away, the impurity injection portion and the transfer gates intersect obliquely between the adjacent transfer gates, with the result that an electric field concentration can be relieved.

For forming the taperingly-etched part of the insulation film, the step of forming the insulation film on the substrate includes applying an insulation material onto the substrate such that a concave portion is formed by the insulation film between the adjacent transfer gates. With this structure, when the insulation film is etched back, etching proceeds at corner portions of the concave portion, and a tapered configuration is thus formed.

Such a concave portion of the insulation film is formed by applying an insulation material by a spin-coating method or depositing an insulation material by sub atmospheric-chemical vapor deposition.

According to another embodiment of the present invention, there is provided a solid-state image pickup apparatus including: a plurality of light-receiving portions formed on a substrate; a plurality of transfer gates connected to the plurality of light-receiving portions; and an impurity injection portion provided such that a center portion thereof is formed at a position surrounded by the plurality of transfer gates and a part thereof extending between the adjacent transfer gates from the center portion tapers away. There is also provided an electronic apparatus that uses the solid-state image pickup apparatus.

With this structure, since the impurity injection portion between the adjacent transfer gates tapers away, the impurity injection portion and the transfer gate intersect obliquely between the adjacent transfer gates, with the result that an electric field concentration can be relieved.

According to the embodiments of the present invention, it is possible to form an impurity injection portion to be a charge voltage conversion portion at an accurate position and reduce a difference in characteristics of pixels sharing the charge voltage conversion portion. It is also possible to relieve an electric field concentration between the transfer gate and the impurity injection portion and suppress generation of a white spot due to a leak current.

These and other objects, features and advantages of the present invention will become more apparent in light of the following detailed description of best mode embodiments thereof, as illustrated in the accompanying drawings.

BRIEF DESCRIPTION OF DRAWINGS

FIG. 10 are diagrams for explaining a solid-state image pickup apparatus according to the embodiment.

DESCRIPTION OF PREFERRED EMBODIMENTS

Hereinafter, an embodiment of the present invention will be described with reference to the drawings. It should be noted that descriptions will be given in the following order.
1. Entire structure of solid-state image pickup apparatus (structure of CMOS image sensor and circuit structure of unit pixel)
2. Method of producing solid-state image pickup apparatus (production methods of comparative example and embodiment of present invention)
3. Solid-state image pickup apparatus (structure of pixel portion and line of electric force)
4. Electronic apparatus <1. Entire Structure of Solid-state Image Pickup Apparatus>
(Structure of CMOS Image Sensor)

Figure 1:
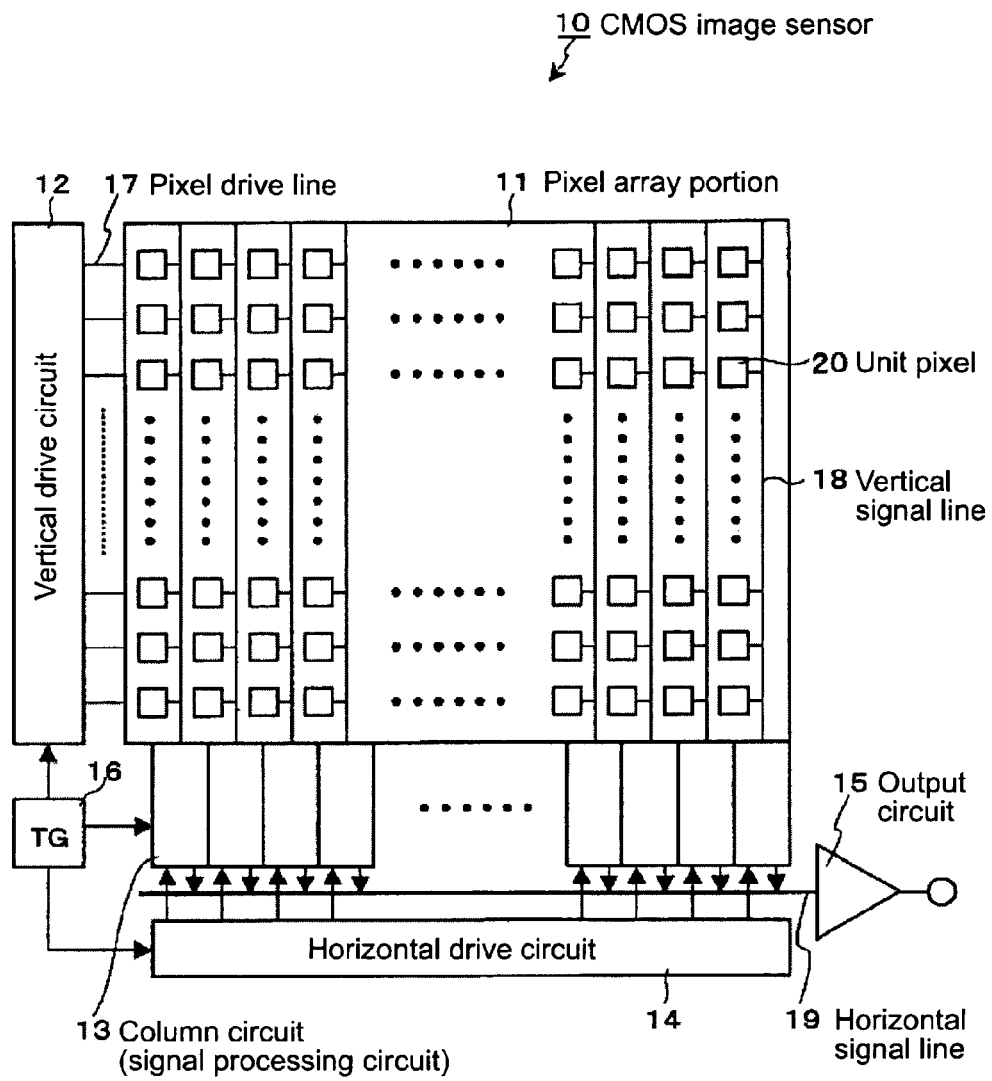
FIG. 1 is a diagram for explaining an entire structure of a solid-state image pickup apparatus constituted of a CMOS image sensor.

FIG. 1 is a diagram for explaining an entire structure of a solid-state image pickup apparatus constituted of a CMOS image sensor. As shown in FIG. 1, a CMOS image sensor 10 includes a pixel array portion 11 formed on a semiconductor substrate (chip) (not shown) and peripheral circuits provided on the same semiconductor substrate as the pixel array portion 11. As the peripheral circuits of the pixel array portion 11, a vertical drive circuit 12, column circuits 13 each as a signal processing circuit, a horizontal drive circuit 14, an output circuit 15, a timing generator (TG) 16, and the like are used.

On the pixel array portion 11, unit pixels (hereinafter, may simply be referred to as "pixels") 20 including a photoelectric conversion device for photoelectrically converting incident visible light into a charge amount corresponding to a light amount of the visible light are arranged two-dimensionally in a matrix. A specific structure of the unit pixels 20 will be described later.

In addition, on the pixel array portion 11, with respect to the matrix alignment of the unit pixels 20, a pixel drive line 17 is formed along a lateral direction in the figure (pixel alignment direction in pixel row) for each pixel row, and a vertical signal line 18 is formed along a longitudinal direction in the figure (pixel alignment direction in pixel column) for each pixel column. Although the pixel drive line 17 is illustrated as one line, the number of lines is not limited to one. One end of each of the pixel drive lines 17 is connected to an output terminal corresponding to the corresponding one of the pixel rows of the vertical drive circuit 12.

The vertical drive circuit 12 is constituted of a shift register, an address decoder, and the like. Though an illustration of a detailed structure of the vertical drive circuit 12 will be omitted, the vertical drive circuit 12 includes a read-out scan system for sequentially performing selective scanning on the pixels 20 to read out signals in a row unit. The vertical drive circuit 12 also includes a sweep-out scan system for performing, with respect to a read-out row on which read-out scanning is performed by the read-out scan system, sweep-out scanning for sweeping out (resetting) unnecessary charges from the photoelectric conversion device of the pixels 20 of the read-out row, that is ahead of the read-out scanning only by a time corresponding to a shutter speed.

By the sweep-out (reset) of unnecessary charges by the sweep-out scan system, a so-called electronic shutter operation is carried out. The electronic shutter operation used herein refers to an operation of discarding optical charges of the photoelectric conversion device and newly starting an exposure (starting to store optical charges).

A signal read out by the read-out operation of the read-out scan system is a signal corresponding to an amount of incident light obtained after the read-out operation or the electronic shutter operation performed right before that read-out operation. A period from a read-out timing of the previous read-out operation or a sweep-out timing of the previous electronic shutter operation to a read-out timing of the current read-out operation becomes a storage time period (exposure time period) of optical charges in the unit pixels 20.

Signals output from the unit pixels 20 of the pixel row selected by the scanning of the vertical drive circuit 12 are supplied to the column circuits 13 via the respective vertical signal lines 18. The column circuits 13 receive the signals output from the pixels 20 of the selected row for each of the pixel columns of the pixel array portion 11 and performs signal processing such as a CDS (Correlated Double Sampling) for removing a fixed pattern noise unique to the pixels, a signal amplification, and an AD conversion on the signals.

It should be noted that although the column circuits 13 are arranged to have a one-on-one relationship with the pixel columns in this case, the structure is not limited thereto. For example, it is also possible to provide one column circuit 13 for a plurality of pixel columns (vertical signal lines 18) so that the column circuit 13 is shared time-divisionally among the plurality of pixel columns.

The horizontal drive circuit 14 is constituted of a shift register, an address decoder, and the like and sequentially selects the column circuits 13 by successively outputting horizontal scan pulses. It should be noted that although not shown, a horizontal selection switch is connected between each output stage of the column circuits 13 and a horizontal signal line 19. The horizontal scan pulses successively output from the horizontal drive circuit 14 sequentially turn on the horizontal selection switches provided at the output stages of the column circuits 13. By sequentially turning on the horizontal selection switches in response to the horizontal scan pulses, pixel signals processed by the column circuits 13 for each pixel column are sequentially output to the horizontal signal line 19.

The output circuit 15 performs various types of signal processing on the image signals sequentially supplied from the column circuits 13 via the horizontal signal line 19 and outputs the processed signals. Specifically, the signal processing carried out in the output circuit 15 may involve only buffering or may involve a black-level adjustment, a variation correction of each column, a signal amplification, color relation processing, and the like before the buffering, for example.

The timing generator 16 generates various timing signals and controls driving of the vertical drive circuit 12, the column circuits 13, the horizontal drive circuit 14, and the like based on those various timing signals.

(Circuit Structure of Unit Pixel)

Figure 2:
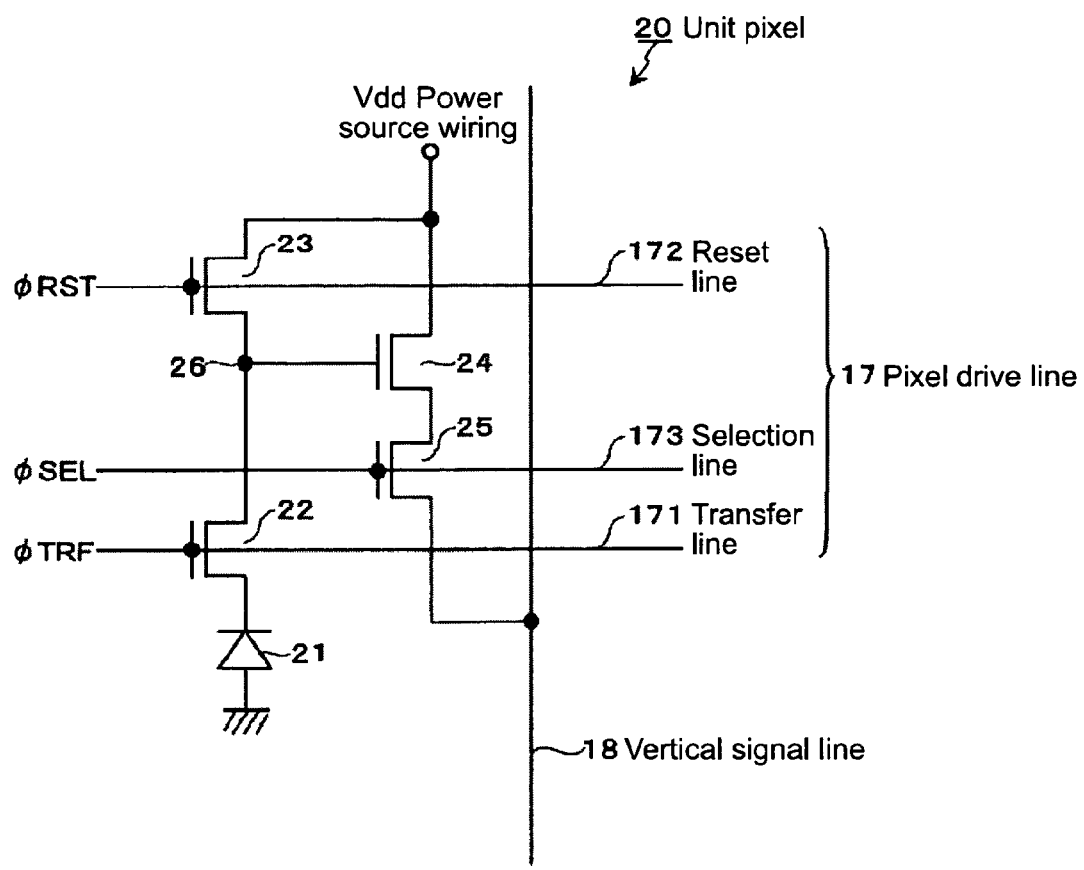
FIG. 2 is a circuit diagram showing an example of a circuit structure of a unit pixel.

FIG. 2 is a circuit diagram showing an example of a circuit structure of the unit pixel. The unit pixel 20 of this example includes, in addition to the photoelectric conversion device as the light-receiving portion such as a photodiode 21, for example, four transistors of a transfer transistor 22, a reset transistor 23, an amplification transistor 24, and a selection transistor 25.

Here, as each of the transistors 22 to 25, an N-channel MOS transistor is used, for example. However, a combination of conductivity types of the transfer transistor 22, the reset transistor 23, the amplification transistor 24, and the selection transistor 25 in this case is a mere example, and the combination is not limited thereto.

With respect to the unit pixels 20, as the pixel drive line 17, for example, three lines of a transfer line 171, a reset line 172, and a selection line 173 are provided in common for all the pixels in the same pixel row. One end of each of the transfer line 171, the reset line 172, and the selection line 173 is connected in a pixel-row unit to a corresponding one of output terminals corresponding to the respective pixel rows of the vertical drive circuit 12.

An anode of the photodiode 21 is connected to a negative-side power source to be, for example, grounded, and photoelectrically converts received light into optical charges (photoelectrons in this case) in a charge amount corresponding to a received-light amount. A cathode electrode of the photodiode 21 is electrically connected to a gate electrode of the amplification transistor 24 via the transfer transistor 22. A node electrically connected to the gate electrode of the amplification transistor 24 will be referred to as FD (charge voltage conversion portion: Floating Diffusion) portion 26.

The transfer transistor 22 is connected between the cathode electrode of the photodiode 21 and the FD portion 26 and is turned on when a transfer pulse φ TRF having an active high level (Vdd level) (hereinafter, referred to as "High active") is imparted to the gate electrode via the transfer line 171. Accordingly, optical charges photoelectrically converted by the photodiode 21 are transferred to the FD portion 26.

The reset transistor 23 has a drain electrode connected to a pixel power source Vdd and a source electrode connected to the FD portion 26 and is turned on when a High active reset pulse φ RST is imparted to the gate electrode via the reset line 172. Accordingly, prior to the transfer of the signal charges from the photodiode 21 to the FD portion 26, charges of the FD portion 26 are discarded to the pixel power source Vdd so that the FD portion 26 is reset.

The amplification transistor 24 has a gate electrode connected to the FD portion 26 and a drain electrode connected to the pixel power source Vdd and outputs a potential of the FD portion 26 reset by the reset transistor 23 as a reset level. Furthermore, the amplification transistor 24 outputs a potential of the FD portion 26 to which signal charges have been transferred by the transfer transistor 22 as a signal level.

The selection transistor 25 has a drain electrode connected to a source of the amplification transistor 24 and a source electrode connected to the vertical signal line 18, for example, and is turned on when a High active selection pulse φ SEL is imparted to a gate via the selection line 173. Accordingly, a signal output from the amplification transistor 24 while the unit pixel 20 is in a selected state is relayed to the vertical signal line 18.

It should be noted that for the selection transistor 25, a circuit structure in which the selection transistor 25 is connected between the pixel power source Vdd and the drain of the amplification transistor 24 is also possible.

Moreover, the unit pixel 20 is not limited to the pixel structure constituted of the four transistors, and any pixel structure including a pixel structure constituted of three transistors having both the functions of the amplification transistor 24 and the selection transistor 25 may be adopted.

In the solid-state image pickup apparatus of this embodiment, a structure in which a single FD portion 26 is shared by a plurality of photodiodes 21 is adopted. Therefore, by accurately positioning the FD portion 26 with respect to the plurality of photodiodes 21, variations of signals taken in by the plurality of photodiodes 21 can be suppressed.

<2. Method of Producing Solid-state Image Pickup Apparatus)

Next, a method of producing a solid-state image pickup apparatus of this embodiment will be described. First, prior to describing this embodiment, a comparative example will be described.

REGARDING COMPARATIVE EXAMPLE

Figure 3A:
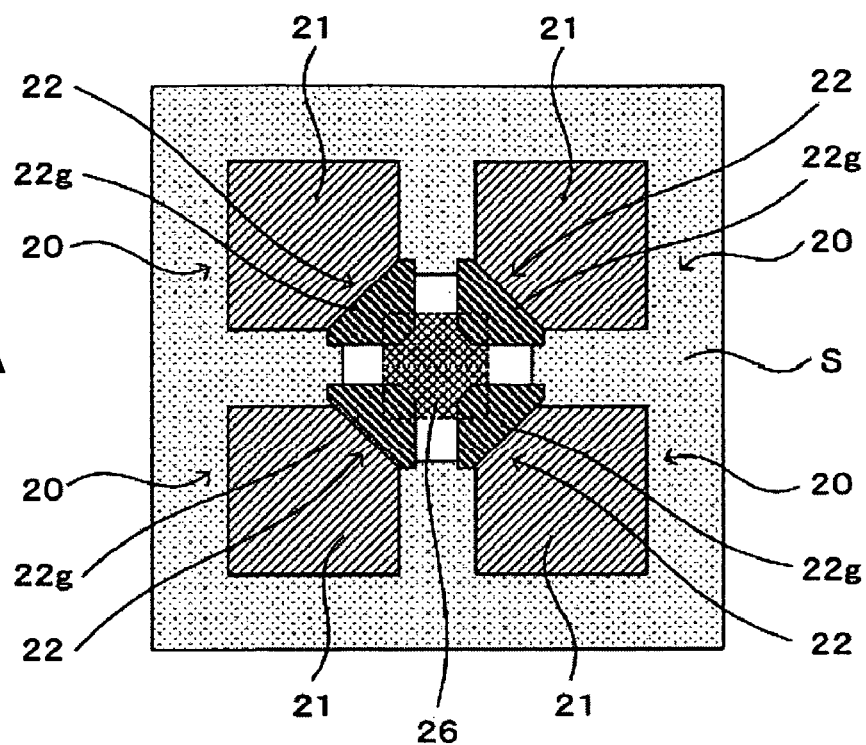
FIG. 3 are diagrams for explaining a layout of a pixel portion of a solid-state image pickup apparatus of a comparative example.

FIG. 3 are diagrams for explaining a layout of a pixel portion of a solid-state image pickup apparatus of a comparative example. As shown in FIG. 3A, in the layout, a total of four photodiodes 21 arranged two each in longitudinal and lateral directions share a single FD portion 26. The FD portion 26 is provided at a center of the arrangement of the four photodiodes 21. Each of the photodiodes 21 is provided with the transfer transistor 22 at a corner portion on the FD portion 26 side. By imparting transfer pulses to transfer gates 22g of the FD portion 26, charges obtained by a photoelectric conversion by the photodiodes 21 are transferred to the FD portion 26.

For producing such a pixel portion, the photodiodes 21, the transfer transistors 22, and the transfer gates 22g are first formed on a substrate. After that, a resist is applied onto the substrate which is then subjected to patterning by an exposure and development, whereby an opening is formed. By injecting an impurity via the opening of the resist, the FD portion 26 is formed at a position corresponding to the opening.

In the example shown in FIG. 3A, the broken line at the center surrounded by the four transfer gates 22g indicates the opening position of the resist, and by injecting an impurity into the opening, the FD portion 26 is formed at the position corresponding to the opening.

Figure 3B:
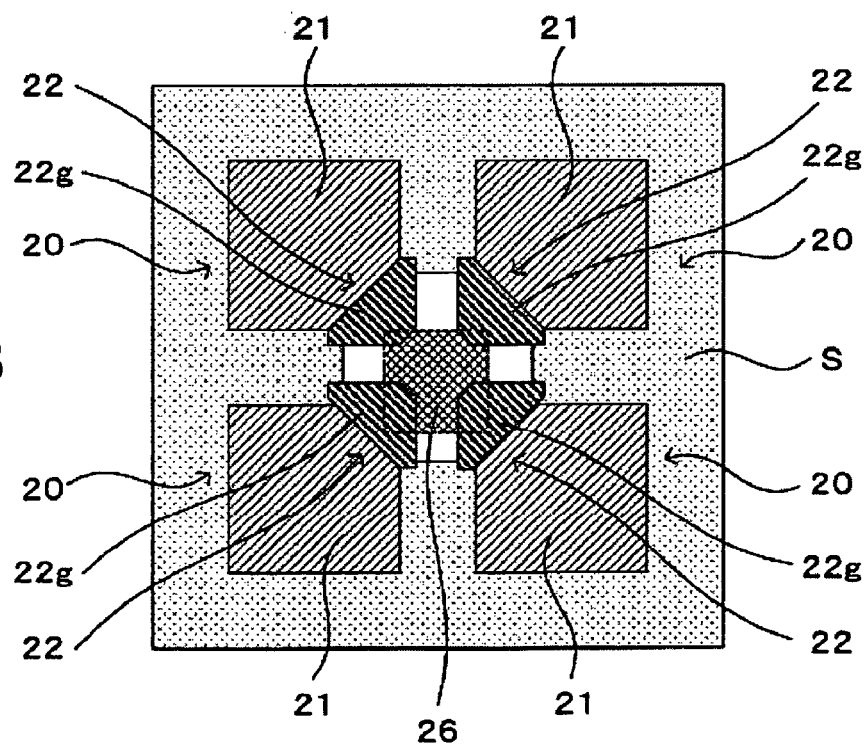

However, if the position of the opening of the resist to be a mask is deviated when forming the FD portion 26 by the impurity injection, the position of the FD portion 26 formed by the impurity injection is also deviated. FIG. 3B is a diagram showing a case where the position of the opening of the resist is deviated. In the figure, the broken line at the center surrounded by the four transfer gates 22g indicates the opening position of the resist. In this case, the opening of the resist is deviated in a downward direction in the figure as compared to FIG. 3A showing an accurate position. If the opening of the resist is deviated as described above, the FD portion 26 that is formed by the impurity injection using the resist as a mask is also deviated.

For example, due to the deviation of the FD portion 26 in the downward direction in the figure, a contact length between the upper two transfer gates 22g and, the FD portion 26 and a contact length between the lower two transfer gates 22g and the FD portion 26 differ, with the result that charge amounts to be transferred from the photodiodes 21 to the FD portion 26 differ. In other words, variations in characteristics are caused among the pixels.

Figure 4A:
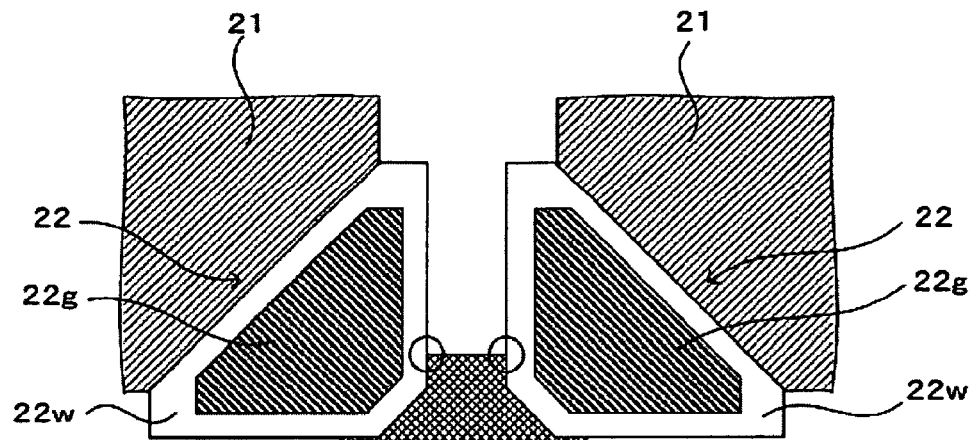
FIG. 4 are diagrams for explaining an electric field concentration in the structure of the comparative example.
Figure 4B:
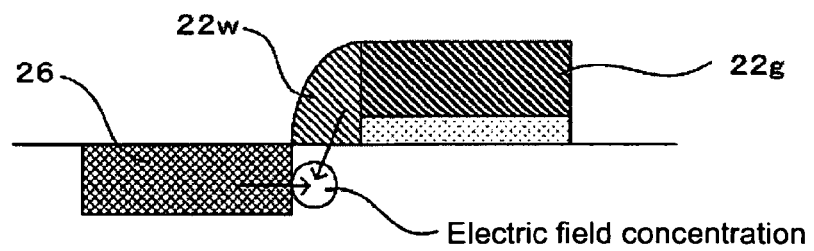

FIG. 4 are diagrams for explaining an electric field concentration in the structure of the comparative example. As shown in FIG. 4, even when the FD portion 26 is formed at an accurate position, a high-electric-field area (circles in figures) is generated at a boundary between each of the transfer gates 22g and the FD portion 26. This is because, as shown in the schematic cross-sectional diagram of the transfer gate portion shown in FIG. 4B, an electric field concentration occurs below a sidewall 22w due to influences of an electric field of the gate from the transfer gate 22g and an electric field generated at a junction portion of the FD portion 26. Such an electric field concentration causes a leak current and a white-spot defect.

(Method of Producing Solid-State Image Pickup Apparatus According to Embodiment of Present Invention)

A method of producing a solid-state image pickup apparatus according to this embodiment solves the above problems. FIGS. 5 to 9 are diagrams for explaining the method of producing a solid-state image pickup apparatus of this embodiment. Here, FIGS. 5 to 8 are schematic cross-sectional diagrams, and FIG. 9 are schematic plan views.

Figure 5A:
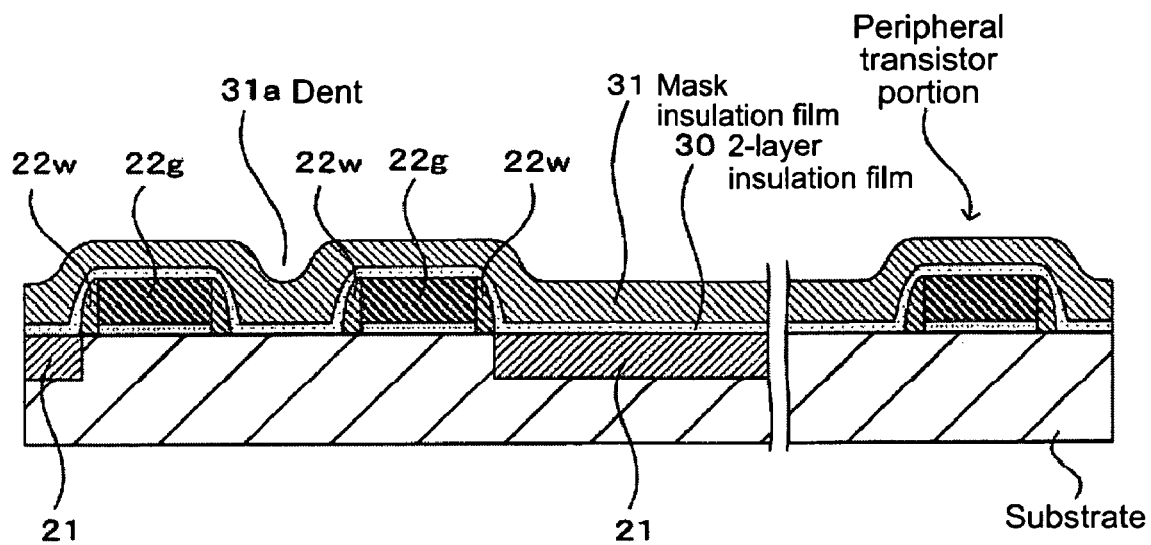
FIG. 5 are diagrams for explaining a method of producing a solid-state image pickup apparatus according to an embodiment of the present invention.

First, as shown in FIG. 5A, photodiodes 21 that convert incident light into electrical signals are formed in predetermined areas on a substrate formed of, for example, silicon. Further, transfer gates 22g of transfer transistors are formed adjacent to the photodiodes 21. The transfer gates 22g are formed via a gate insulation film. Then, after forming an LDD (Lightly Doped Drain) (not shown) on the substrate on both sides of each of the transfer gates 22g, sidewalls 22w are formed on both sides of each of the transfer gates 22g. It should be noted that in the example shown in FIG. 5A, the transfer gate 22g connected to the photodiode 21 and the transfer gate 22g connected to the photodiode 21 adjacent to that photodiode 21 are illustrated. After that, a 2-layer insulation film 30 formed of $SiO_2$ and SiN is formed on the entire surface of the substrate.

Next, a mask insulation film 31 is formed on the 2-layer insulation film 30. In this embodiment, SOG (Spin on Glass) is used for the mask insulation film 31. The SOG is a film formed by applying $SiO_2$ by a spin-coating method, and $SiO_2$ flows from a convex portion of a base configuration to a concave portion due to a liquidity so that the concave portion is formed to be slightly thicker than the convex portion.

Figure 9A:
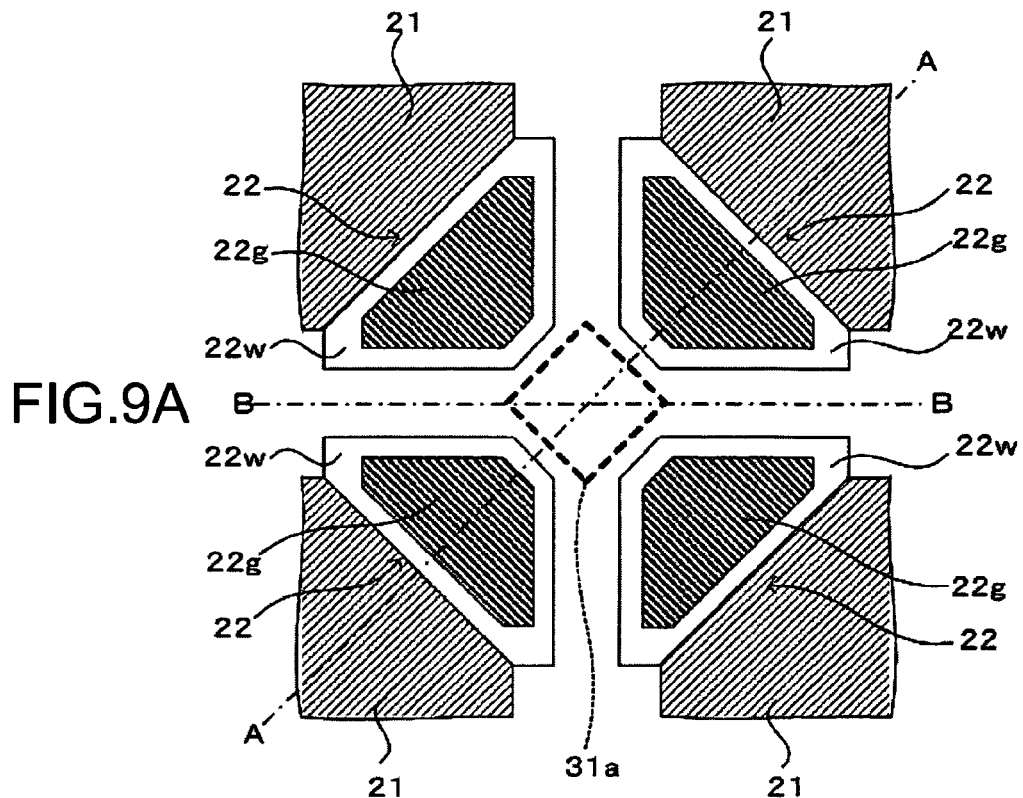
FIG. 9 are diagrams for explaining the method of producing a solid-state image pickup apparatus according to the embodiment.

Here, at a portion surrounded by the transfer gates 22g, a dent 31a is formed by the mask insulation film 31. FIG. 9A is a schematic plan view for explaining a state after the mask insulation film is applied. FIG. 9A shows a state where the dent 31a of the mask insulation film 31 is formed at a center portion surrounded by the transfer gates 22g.

The four transfer gates 22g are structured as convex portions, and an area surrounded by the four transfer gates 22g is structured as a concave portion. Each of the four transfer gates 22g has an oblique straight-line portion on the center portion side, and the concave portion surrounded by the four transfer gates 22g thus becomes a rectangular area with the straight-line portions as the four sides. Moreover, of the four transfer gates 22g, a concave portion is also formed between the adjacent transfer gates 22g arranged in the lateral direction and the adjacent transfer gates 22g arranged in the longitudinal direction. Accordingly, the concave portion has a structure extending in a cross shape with the rectangular area as a center.

Figure 5B:
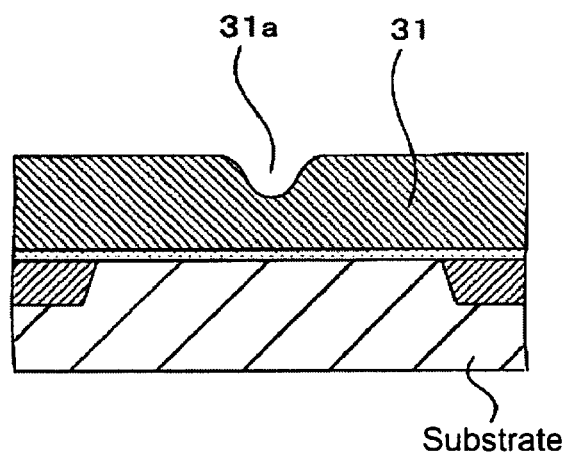

When forming the mask insulation film 31, since the rectangular area at the center surrounded by the four transfer gates 22g out of the concave portion is larger than the portions between the two adjacent transfer gates 22g, the dent 31a of the mask insulation film 31 is formed in the rectangular area. The A-A cross section of FIG. 9A is shown in FIG. 5A, and the B-B cross section of FIG. 9A is shown in FIG. 5B. As described above, the dent 31a of the mask insulation film 31 is formed in the rectangular area at the center surrounded by the four transfer gates 22g.

Figure 6:
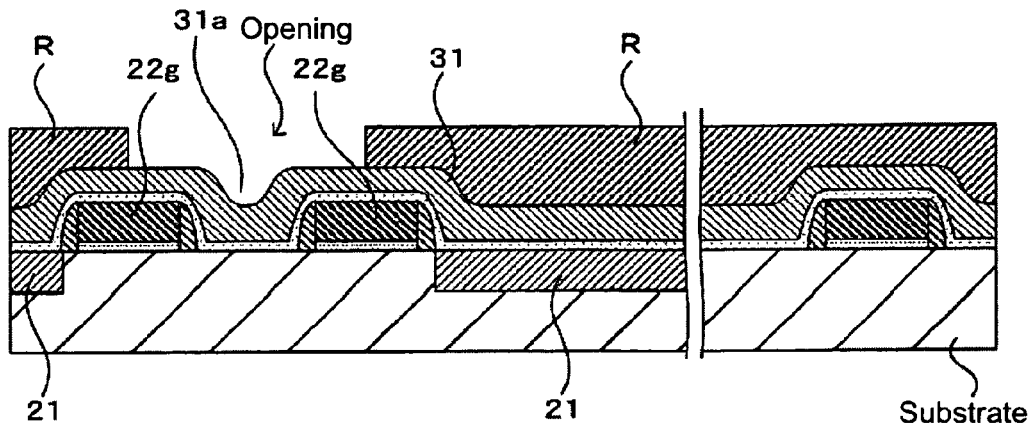
FIG. 6 is a diagram for explaining the method of producing a solid-state image pickup apparatus according to the embodiment.

Next, as shown in FIG. 6, a resist R is applied onto the substrate, and an opening is formed at the center portion surrounded by the transfer gates 22g by a photolithography method. The opening is formed to be larger than the dent 31a of the mask insulation film 31. It should be noted that the resist R does not always need to be formed and only needs to be applied when wishing to reinforce protection upon leaving the mask insulation film 31 above the photodiodes 21 after etching processing.

Next, the mask insulation film 31 is etched via the resist R. Accordingly, the mask insulation film 31 is etched back, and the base of the portion surrounded by the transfer gates 22g is exposed as shown in FIG. 7A.

Figure 9B:
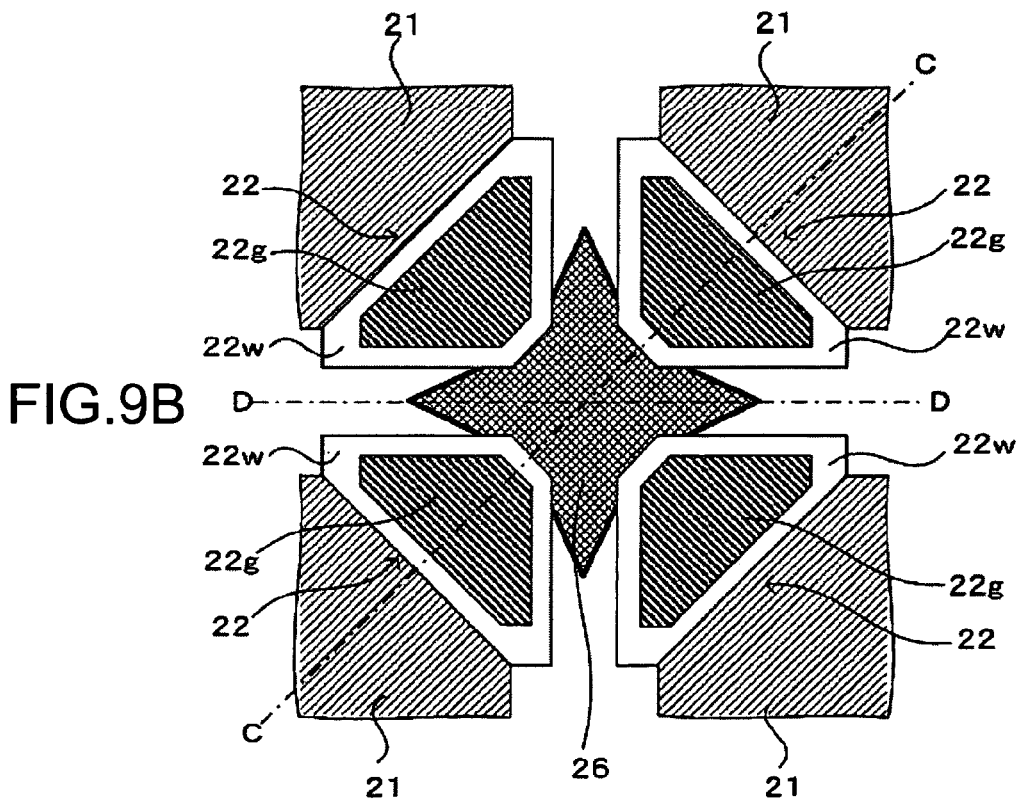

FIG. 9B is a schematic plan view showing a state where the mask insulation film 31 is etched back. Since the dent is formed on the mask insulation film 31 at the center portion surrounded by the transfer gates 22g as shown in FIG. 9A, when the mask insulation film 31 is etched back in this state, the dent of the mask insulation film 31 gradually becomes larger to eventually expose the base. At this time, the base is exposed in a state where, between the adjacent transfer gates 22g arranged in the longitudinal and lateral directions, the etched portions at corner portions of the dent of the mask insulation film 31 extend in directions of the respective corner portions while tapering away.

Figure 7A:
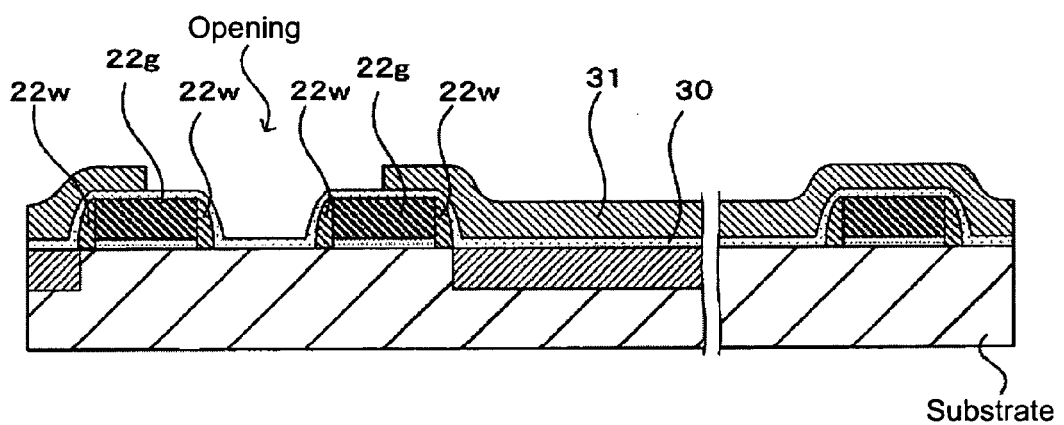
FIG. 7 are diagrams for explaining the method of producing a solid-state image pickup apparatus according to the embodiment.
Figure 7B:
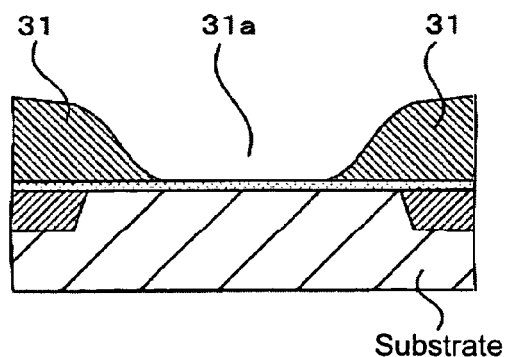

Here, the C-C cross section of FIG. 9B is shown in FIG. 7A, and the D-D cross section of FIG. 9B is shown in FIG. 7B. As described above, the etched portions of the mask insulation film 31 at the center surrounded by the four transfer gates 22g extend while tapering away between the adjacent transfer gates 22g arranged in the longitudinal and lateral directions.

The etch back is carried out until the etched portions of the mask insulation film 31 reach the sidewalls 22w (2-layer insulation film 30 above sidewalls 22w) of the peripheral transfer gates 22g. As a result, the sidewall 22w portions of the transfer gates 22g are exposed.

Figure 8A:
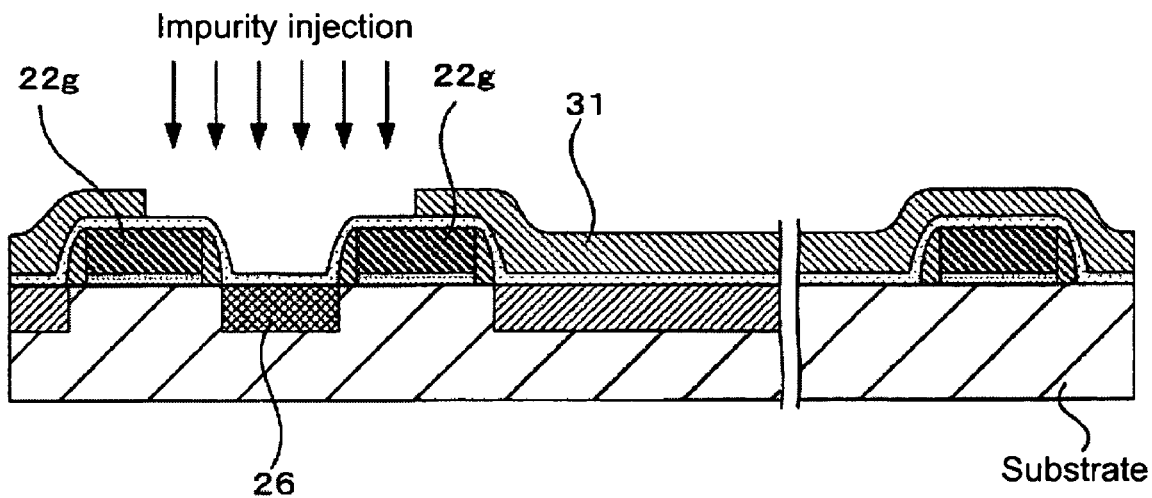
FIG. 8 are diagrams for explaining the method of producing a solid-state image pickup apparatus according to the embodiment.
Figure 8B:
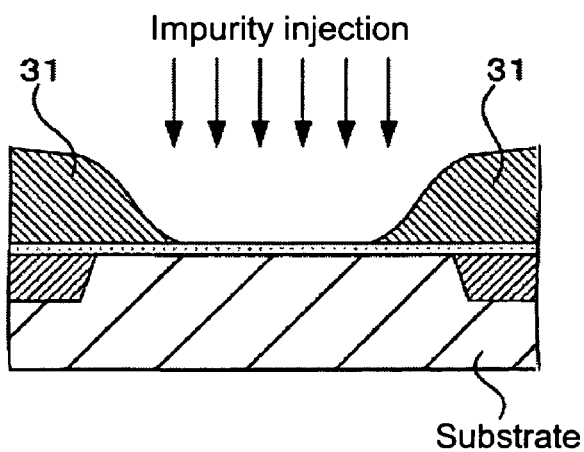

Next, as shown in FIG. 8, an impurity injection is carried out via the etched-back mask insulation film 31 to thus form an FD portion 26 as an impurity injection portion at a portion surrounded by the transfer gates 22g. As described above, the base is exposed by the etch back of the mask insulation film 31. At this time, since the sidewall 22w portions of the transfer gates 22g are exposed, an impurity is injected in a self-aligning manner by the sidewall 22w portions in the impurity injection. Accordingly, the FD portion 26 is formed at an accurate position without a positional deviation with respect to the four transfer gates 22g.

Moreover, as shown in FIG. 9B, the etched portions of the mask insulation film 31 extend while tapering away between the adjacent transfer gates 22g arranged in the longitudinal and lateral directions by the etch back of the mask insulation film 31. Thus, if an impurity is injected via the mask insulation film 31, the shape of the tapered portions is reflected, with the result that the FD portion 26 formed at that portion is also tapered. By forming the FD portion 26 in such a shape, an electric field concentration between the FD portion 26 and the transfer gates 22g is relieved, the details of which will be described later.

After the impurity injection, the mask insulation film 31 is removed by wet etching or the like, and an insulation film is formed thereafter to perform a planarization process. It should be noted that the mask insulation film 31 may be left unetched, and an insulation film may be formed thereafter to perform the planarization process.

In the production method described above, the example in which the SOG obtained by the spin-coating method using $SiO_2$ is used as the mask insulation film 31 has been described. However, other insulation materials may be used instead. For example, an insulation material may be deposited by SA-CVD (Sub Atmospheric-Chemical Vapor Deposition), or other materials such as BPSG (Boron Phosphor Silicate Glass) may be used as the insulation material. It should be noted that since the dent 31a is formed between the transfer gates 22g when forming the mask insulation film 31, it is desirable to use a material having a liquidity.

Moreover, although this embodiment has described the example in which the FD portion 26 is formed at a position surrounded by the four transfer gates 22g arranged two each in the longitudinal and lateral directions, not all of the four transfer gates 22g need to be the transfer gate 22g. Specifically, with at least one of them as the transfer gate 22g, the other three that are not used as the transfer gates are dummy patterns having the same shape (convex shape) as the transfer gate.

Further, this embodiment has exemplified the layout in which the FD portion 26 is formed at a position surrounded by the four transfer gates 22g arranged two each in the longitudinal and lateral directions. However, other layouts (other layouts in which FD portion is shared) are also applicable.

<3. Solid-state Image Pickup Apparatus>
(Structure of Pixel Portion)

FIG. 10 are diagrams for explaining a solid-state image pickup apparatus of this embodiment. FIG. 10A is a schematic plan view showing a main portion of the solid-state image pickup apparatus of this embodiment, and FIG. 10B is a schematic plan view showing a main portion of a solid-state image pickup apparatus of a comparative example. The figures center on the FD portion 26 shared by four unit pixels out of the entire structure shown in FIG. 1. It should be noted that FIG. 10B is a schematic plan view showing the main portion of the comparative example.

The solid-state image pickup apparatus of this embodiment includes the plurality of photodiodes 21 formed on the substrate, the transfer gates 22g of the transfer transistors 22 connected to the photodiodes 21, and the FD portion 26 formed at a position surrounded by the plurality of photodiodes 21. Of those, the FD portion 26 is formed such that a center portion thereof is provided at a position surrounded by the four transfer gates 22g arranged two each in the longitudinal and lateral directions and portions extending from the center portion thereof, that is, portions extending between the two adjacent transfer gates 22g arranged in the longitudinal and lateral directions taper away.

Here, in the comparative example shown in FIG. 10B, while the FD portion 26 is formed at a center of the arrangement of the four transfer gates 22g arranged two each in the longitudinal and lateral directions as in this embodiment, portions extending between the adjacent transfer gates 22g arranged in the longitudinal and lateral directions are not tapered. In other words, an end portion of the FD portion 26 is orthogonal to an end portion of the adjacent transfer gates 22g.

(Line of Electric Force)

In the structure of the comparative example as described above, as indicated by the arrows of FIG. 10B, lines of electric forces from the transfer gates 22g are concentrated at intersections of the transfer gates 22g and the FD portion 26, and high-electric-field areas are thus caused at the intersection portions (circles in figure) of the transfer gates 22g and the FD portion 26 below the sidewalls 22w, thus causing a leak current and a white-spot defect.

On the other hand, when the portions of the FD portion 26 extending between the adjacent transfer gates 22g arranged in the longitudinal and lateral directions are tapered as in the structure of this embodiment shown in FIG. 10A, an angle at which the end portion of the FD portion 26 intersects with the end portion of the transfer gates 22g becomes oblique. As a result, the end portion of the FD portion 26 gradually moves away from the end portions of the transfer gates 22g (sidewalls) as a distance from the center portion increases.

Therefore, as indicated by the arrows of FIG. 10A, the lines of electric forces extending from the transfer gates 22g to the FD portion 26 are dispersed, and the number of lines of electric forces extending toward the high-electric-field areas (circles in figure) below the sidewalls 22w is reduced, which means that a high electric field is relieved. Accordingly, a leak current and a white-spot defect are suppressed.

It should be noted that although the layout in which the FD portion 26 is formed at a position surrounded by the four transfer gates 22g arranged two each in the longitudinal and lateral directions has been exemplified in this embodiment, other layouts (other layouts that share FD portion) are also applicable.

<4. Electronic Apparatus>

Figure 11:
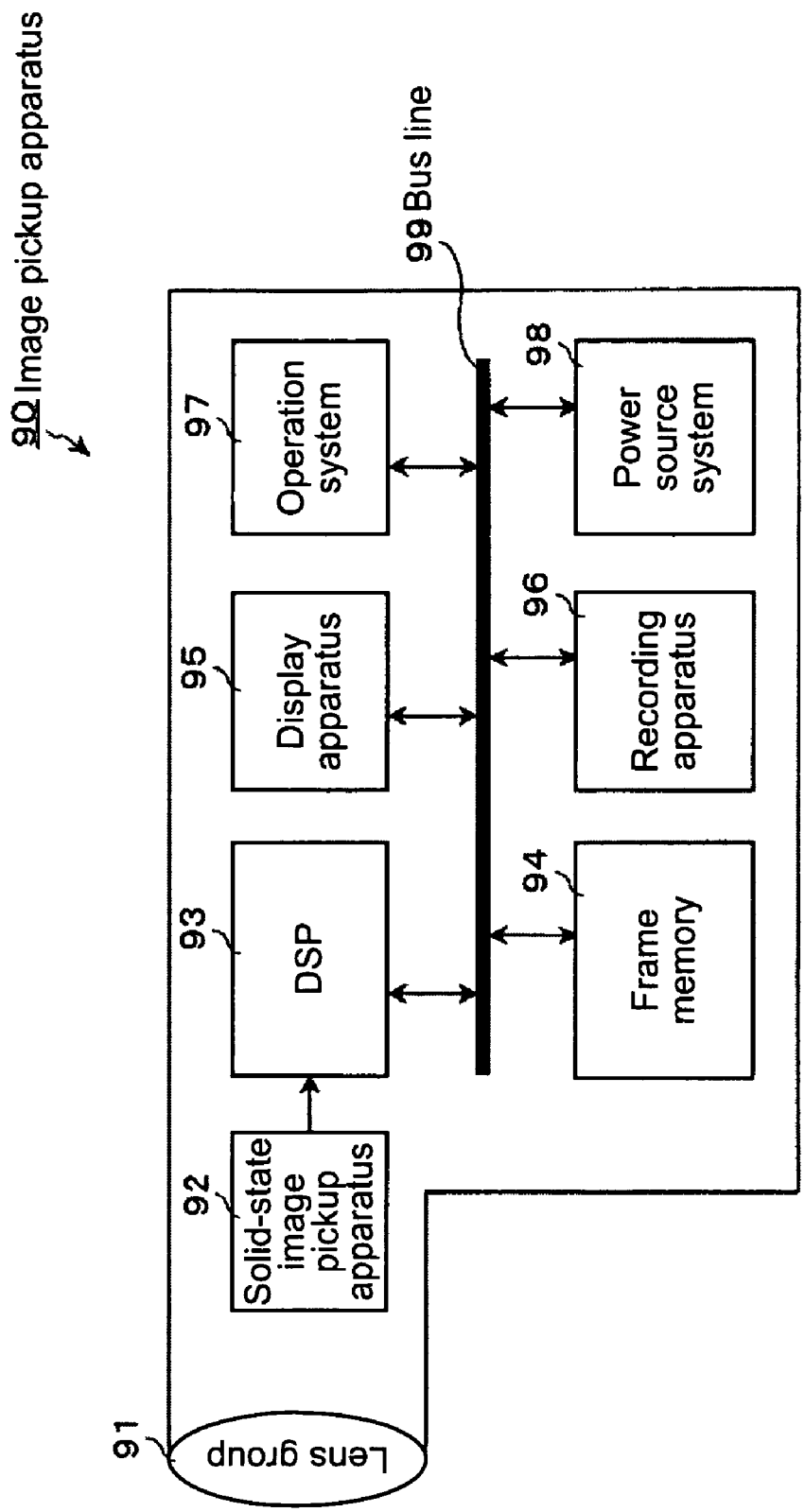
FIG. 11 is a block diagram showing a structural example of an image pickup apparatus as an example of an electronic apparatus according to the embodiment.

FIG. 11 is a block diagram showing a structural example of an image pickup apparatus as an example of an electronic apparatus of this embodiment. As shown in FIG. 11, an image pickup apparatus 90 includes an optical system including a lens group 91, a solid-state image pickup apparatus 92, a DSP circuit 93 as a camera signal processing circuit, a frame memory 94, a display apparatus 95, a recording apparatus 96, an operation system 97, a power source system 98, and the like. Of those, the DSP circuit 93, the frame memory 94, the display apparatus 95, the recording apparatus 96, the operation system 97, and the power source system 98 are mutually connected via a bus line 99.

The lens group 91 takes in incident light (image light) from an object and forms an image on an imaging surface of the solid-state image pickup apparatus 92. The solid-state image pickup apparatus 92 converts an amount of incident light imaged on the imaging surface by the lens group 91 into an electrical signal in a pixel unit and outputs the signal as a pixel signal. As the solid-state image pickup apparatus 92, the solid-state image pickup apparatus of this embodiment described above is used.

The display apparatus 95 is constituted of a panel-type display apparatus such as a liquid crystal display apparatus and an organic EL (Electro-Luminescence) display apparatus and displays a moving image or a still image taken by the solid-state image pickup apparatus 92. The recording apparatus 96 records the moving image or the still image taken by the solid-state image pickup apparatus 92 in a nonvolatile memory or a recording medium such as a video tape and a DVD (Digital Versatile Disc).

The operation system 97 issues an operation command for various functions provided to the image pickup apparatus 90 based on a user operation. The power source system 98 variously supplies power as operational power to the DSP circuit 93, the frame memory 94, the display apparatus 95, the recording apparatus 96, and the operation system 97 as appropriate.

Such an image pickup apparatus 90 is applied to a video camera, a digital still camera, and a camera module for mobile equipment such as a cellular phone. By using the solid-state image pickup apparatus of this embodiment described above as the solid-state image pickup apparatus 92, a high-quality image pickup apparatus with suppressed noises can be provided.

The present application contains subject matter related to that disclosed in Japanese Priority Patent Application JP 2009-044975 filed in the Japan Patent Office on Feb. 27, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of producing a solid-state image pickup apparatus, comprising the steps of:
    forming a plurality of light-receiving portions on a substrate;
    forming a plurality of transfer gates to be connected to the plurality of light-receiving portions formed on the substrate;
    forming an insulation film on the substrate;
    exposing a base by etching the insulation film so that the etched part of the insulation film between the adjacent transfer gates tapers away; and
    injecting an impurity into the exposed part using the insulation film that has remained after the etching as a mask to thus form an impurity injection portion
    wherein the impurity injection portion is formed at a shared floating diffusion at a center of an arrangement of four light-receiving portions arranged two each in longitudinal and lateral directions.

2. The method of producing a solid-state image pickup apparatus according to claim 1,
    wherein the step of forming the insulation film on the substrate includes applying an insulation material onto the substrate such that a concave portion is formed by the insulation film between the adjacent transfer gates.

3. The method of producing a solid-state image pickup apparatus according to claim 1,
    wherein the step of forming the insulation film on the substrate includes applying an insulation material by a spin-coating method.

4. The method of producing a solid-state image pickup apparatus according to claim 1,
    wherein the step of forming the insulation film on the substrate includes depositing an insulation material by sub atmospheric-chemical vapor deposition.

5. The method of producing a solid-state image pickup apparatus according to claim 3,
    wherein the insulation film is formed of oxide silicon.

* * * * *